United States Patent
Zhang et al.

(10) Patent No.: US 12,553,125 B2
(45) Date of Patent: Feb. 17, 2026

(54) PROTECTIVE GAS FLOW DURING WAFER DECHUCKING IN PVD CHAMBER

(71) Applicant: Applied Materials, Inc., Santa Clara, CA (US)

(72) Inventors: Fuhong Zhang, San Jose, CA (US); Yu-Ru Li, Yunlin (TW)

(73) Assignee: Applied Materials Inc., Santa Clara, CA (US)

( * ) Notice: Subject to any disclaimer, the term of this patent is extended or adjusted under 35 U.S.C. 154(b) by 452 days.

(21) Appl. No.: 18/084,671

(22) Filed: Dec. 20, 2022

(65) Prior Publication Data

US 2024/0102153 A1  Mar. 28, 2024

Related U.S. Application Data

(60) Provisional application No. 63/410,431, filed on Sep. 27, 2022.

(51) Int. Cl.
C23C 14/50 (2006.01)
C23C 14/56 (2006.01)

(52) U.S. Cl.
CPC ............ *C23C 14/50* (2013.01); *C23C 14/564* (2013.01)

(58) Field of Classification Search
CPC ....... C23C 14/50; C23C 14/564; C23C 16/54; C23C 16/45551; C23C 16/545; C23C 16/4412; C23C 14/568; C23C 16/4401; H01J 37/32449; H01J 37/32715; H01L 21/6719; H01L 21/67196; H01L 21/67201; H01L 21/67173; H01L 21/67184; H01L 21/6776; H01L 21/67161; H01L 21/67155; H01L 21/67017; H01L 21/67069; H01L 21/67748; H01L 21/67751; H01L 21/67745
USPC ........... 216/67, 68, 69, 70, 71; 269/1; 279/1; 118/728, 719, 663; 156/345.51, 345.31, 156/345.32, 345.24
See application file for complete search history.

(56) References Cited

U.S. PATENT DOCUMENTS

| | | | |
|---|---|---|---|
| 5,491,603 A | 2/1996 | Birang et al. | |
| 5,997,962 A * | 12/1999 | Ogasawara | H01J 37/32091 427/535 |
| 7,468,104 B2 * | 12/2008 | Mardian | C23C 16/4401 118/728 |
| 7,892,445 B1 | 2/2011 | Wei et al. | |
| 8,313,612 B2 | 11/2012 | McMillin et al. | |
| 8,832,916 B2 | 9/2014 | Povolny | |
| 10,047,438 B2 * | 8/2018 | Dhas | H01J 37/32697 |
| 10,704,149 B2 * | 7/2020 | Dhas | C23C 16/45525 |
| 2005/0133164 A1 * | 6/2005 | Fischer | H01L 21/68735 156/345.48 |
| 2006/0065630 A1 * | 3/2006 | Sugimoto | H01L 21/31116 257/E21.252 |
| 2007/0285869 A1 | 12/2007 | Howald | |

(Continued)

OTHER PUBLICATIONS

International Search Report and Written Opinion dated Dec. 26, 2023.

*Primary Examiner* — Rudy Zervigon
(74) *Attorney, Agent, or Firm* — Moser Taboada

(57) ABSTRACT

Methods, system, and apparatus for substrate processing are provided for flowing a gas into a substrate processing chamber housing a substrate clamped to a chuck, wherein the gas is introduced at a location above the substrate; and while the gas is introduced, dechucking the substrate.

18 Claims, 2 Drawing Sheets

(56) References Cited

U.S. PATENT DOCUMENTS

| | | | | |
|---|---|---|---|---|
| 2008/0194113 A1 | 8/2008 | Kim et al. | | |
| 2011/0000883 A1* | 1/2011 | Endoh | H01J 37/32082 | 216/67 |
| 2011/0097902 A1 | 4/2011 | Singh et al. | | |
| 2013/0153147 A1* | 6/2013 | Senzaki | C23F 1/08 | 361/234 |
| 2014/0001154 A1* | 1/2014 | Sato | H01J 37/32724 | 156/345.52 |
| 2014/0231389 A1* | 8/2014 | Nagami | H01J 37/32706 | 156/345.28 |
| 2015/0075566 A1* | 3/2015 | Tanikawa | C23C 16/4401 | 29/559 |
| 2015/0354061 A1* | 12/2015 | Dhas | H01L 21/67167 | 901/30 |
| 2018/0347046 A1* | 12/2018 | Dhas | H01L 21/67196 | |
| 2019/0198299 A1* | 6/2019 | Watanabe | H01L 21/67115 | |
| 2020/0332418 A1* | 10/2020 | Dhas | H01L 21/67196 | |
| 2021/0233793 A1* | 7/2021 | Hama | H01L 21/3065 | |

\* cited by examiner

PROTECTIVE GAS FLOW DURING WAFER DECHUCKING IN PVD CHAMBER

CROSS-REFERENCE TO RELATED APPLICATIONS

This application claims benefit of U.S. provisional patent application Ser. No. 63/410,431, filed Sep. 27, 2022, which is herein incorporated by reference in its entirety.

FIELD

Embodiments of the present disclosure generally relate to substrate processing, and more particularly, to substrate dechucking.

BACKGROUND

During some substrate processing (e.g., semiconductor die fabrication) in a processing chamber (e.g., a PVD chamber), small particles may contact a substrate causing damage to the substrate. Thus, such contact with the substrate is unwanted. As features on substrates become smaller, particle contamination tolerances become more stringent and have a greater impact on yield and productivity.

The inventors have observed that particles located between a substrate and a chuck can migrate to an upper surface of the substrate during a dechucking process, which can result in out of tolerance particle contamination. Thus, the inventors provide novel methods and apparatus to reduce or eliminate particle contamination during substrate processing.

SUMMARY

Methods, system, and apparatus for substrate processing are provided herein. In some embodiments, a method of substrate processing includes: flowing a gas into a substrate processing chamber housing a substrate clamped to a chuck, wherein the gas is introduced at a location above the substrate; and dechucking the substrate while the gas is flowing.

In some embodiments, an apparatus for substrate processing includes a processing chamber having an inlet for directing a flow of a gas into the processing chamber and an outlet for discharging the gas from the processing chamber; and a chuck disposed in the process chamber and being configured to support a substrate housed in the processing chamber and to chuck and dechuck the substrate, wherein the inlet is located above the chuck and the outlet is located below the chuck, wherein a gas flow path is defined from the inlet, around the chuck, and to the outlet, and wherein the chuck is configured to dechuck the substrate while the gas is flowing along the gas flow path.

In some embodiments, a system for processing substrates includes an apparatus for substrate processing, comprising: a processing chamber having an inlet for directing a flow of a gas into the processing chamber and an outlet for discharging from the processing chamber; a chuck disposed in the process chamber and being configured to support a substrate housed in the processing chamber and to chuck and dechuck the substrate, wherein the inlet is located above the chuck and the outlet is located below the chuck, wherein a gas flow path is defined from the inlet, around the chuck, and to the outlet, and wherein the chuck is configured to dechuck the substrate while the gas is flowing along the gas flow path; a supply of gas connected to the inlet; and a vacuum source connected to the outlet.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, the appended drawings illustrate only typical embodiments of the disclosure and are therefore not to be considered limiting of scope, for the disclosure may admit to other equally effective embodiments.

Figure 1:
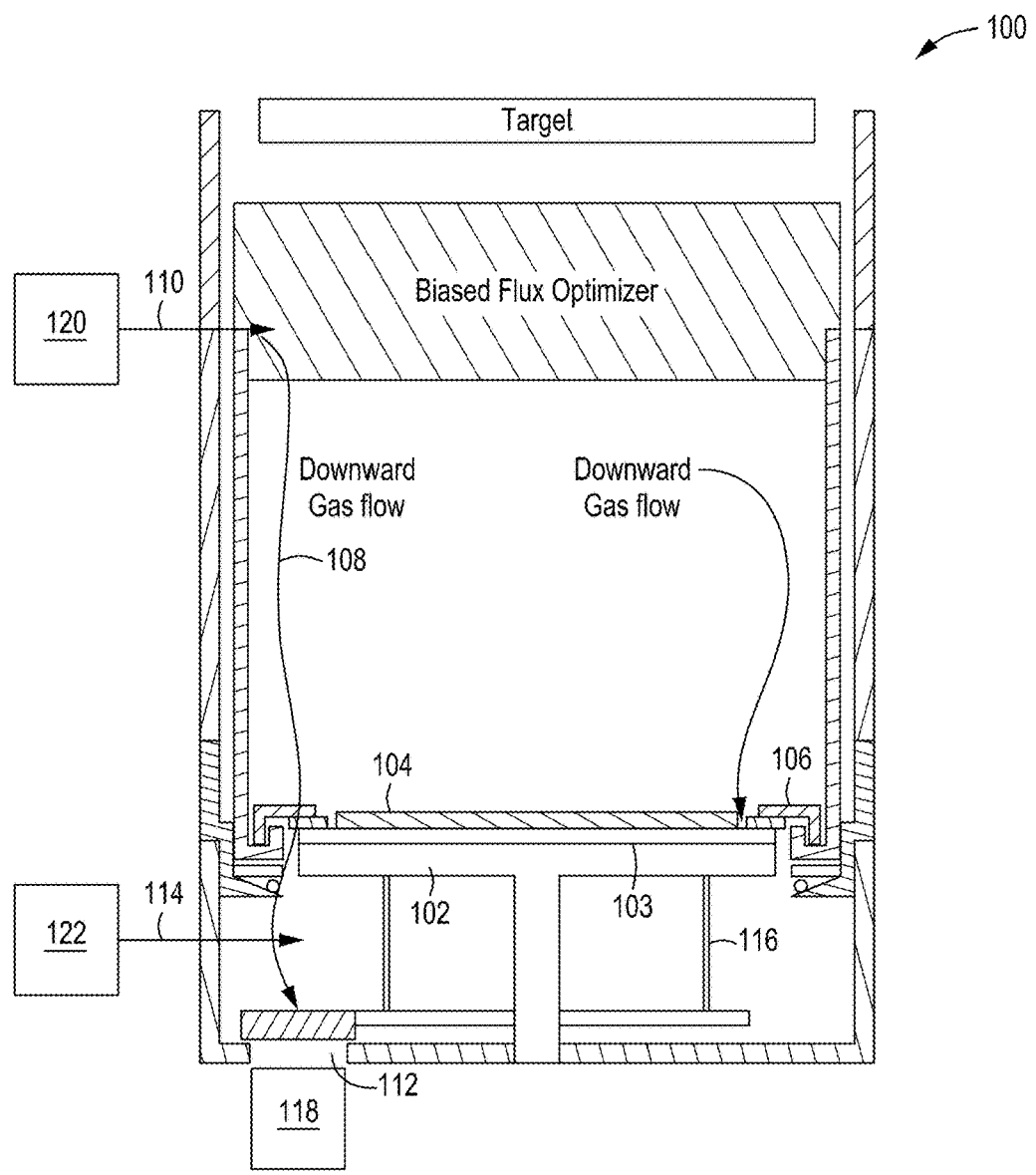
FIG. 1 is a schematic view of a substrate processing chamber in accordance with embodiments of the present disclosure.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Embodiments of a substrate processing method and apparatus are provided herein which can reduce or eliminate migration of particles from a lower surface of a substrate to an upper surface of the substrate during a dechucking process. As a result, productivity and yields can be improved.

FIG. 1 is a schematic view of a substrate processing chamber 100 in accordance with embodiments of the present disclosure. In some embodiments, the substrate processing chamber 100 may be configured as a PVD processing chamber as described in U.S. Pat. No. 11,037,768 B2, issued Jun. 15, 2021, and entitled METHODS AND APPARATUS FOR CONTROLLING ION FRACTION IN PHYSICAL VAPOR DEPOSITION PROCESSES. In some embodiments, and as shown in FIG. 1, the substrate processing chamber 100 may house a substrate support 102 to support a substrate 104. The substrate support 102 may include a chuck 103 to releasably clamp the substrate to the substrate support 102. In some embodiments, the chuck 103 may be an electrostatic chuck. Also, in some embodiments, and a shown in FIG. 1, a process kit 106 (for example, including a shadow ring) may be disposed in the substrate processing chamber 100. The process kit 106 (and the shadow ring) may surround the substrate 104 and the chuck 103.

The substrate processing chamber 100 may have an inlet 110 located above the substrate 104 and the chuck 103. The inlet 110 may be fluidly connected to a supply of gas 120 that is process compatible and will not damage the substrate 104. In some embodiments, the substrate processing chamber 100 may have another inlet 114 located below the substrate 104 and the chuck 103. The inlet 114 may also be connected to a supply of gas 122 that is process compatible. In some embodiments, the inlet 110 and the inlet 114 are connected to the same supply of gas. In some embodiments, process compatible gases include argon and nitrogen. The substrate processing chamber 100 may have an outlet 112 connected to a vacuum pump 118, to discharge gases from the substrate processing chamber 100. A gas flow path 108 may be defined from the inlet 110, through a gap or space between the process kit 106 and the chuck 103, and to the outlet 112.

During substrate processing in the substrate processing chamber 100, the substrate 104 may be tightly clamped to the chuck 103 to prevent the substrate 104 from moving relative to the chuck 103. Once substrate processing is complete, the substrate 104 may be transferred from the substrate processing chamber 100 for additional processing, e.g., in another substrate processing chamber. To transfer the substrate 104, the substrate 104 may undergo a dechucking process to remove the clamping force on the substrate 104 so that lift pins 116 located below the chuck 103 can be used to lift the substrate off the chuck 103.

Figure 2:
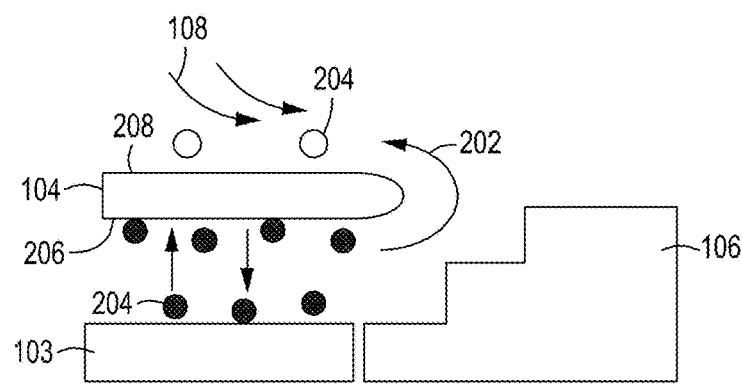
FIG. 2 is an exploded schematic view of a portion of FIG. 1 in accordance with embodiments of the present disclosure.

In some embodiments, when the substrate 104 is dechucked, the substrate 104 is not tightly clamped to the chuck 103, such that particles 204 that are located between a lower surface 206 of the substrate 104 and the chuck 103 may migrate to an upper surface 208 of the substrate 104, as depicted by arrow 202 in FIG. 2. In some embodiments, the gas may be introduced at inlet 110 into the substrate processing chamber 100 at least during the dechucking process to prevent or reduce such migration of particles 204. As depicted in FIG. 2, when the gas from the inlet 110 is flowing in the substrate processing chamber 100, the gas can flow over the upper surface 208 of the substrate 104 and around an outer edge 210 of the substrate 104 and between the chuck 103 and the process kit towards the outlet 112. A flow rate of the gas introduced at the inlet 110 may be controlled and measured by a mass flow controller (not shown). In some embodiments a pressure inside the substrate processing chamber 100 may be monitored and the flow rate of gas may be controlled based on the pressure. For example, in some embodiments, the flow of gas into the substrate processing chamber 100 may be controlled to maintain a pressure less than 150 mTorr. Such pressures may limit the relative movement between the unclamped substrate 104 and the chuck 103.

Figure 3:
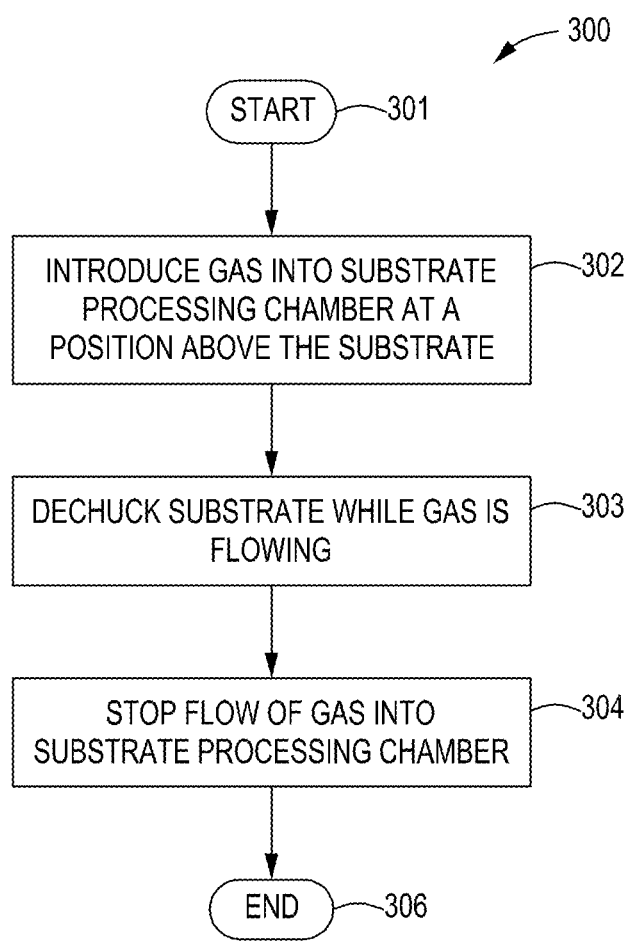
FIG. 3 is a flow chart showing a method in accordance with embodiments of the present disclosure.

FIG. 3 is a flow chart of a substrate processing method 300 in accordance with embodiments of the present disclosure. At 301 some substrate processing (e.g., PVD deposition, etching, etc.) has ended and the substrate 104 is clamped to the chuck 103. At 302 the gas may be introduced from inlet 110 above the substrate 104 into the substrate processing chamber 100. The gas flows downward along gas flow path 108 to the outlet 112. At 303 a dechucking process may begin and be performed while the gas continues to be introduced from inlet 110. After the dechucking process ends, the gas flow from inlet 110 may be turned off at 304. At 306 the method 300 may end, whereupon the dechucked substrate 104 may be transferred to another substrate processing chamber for additional processing.

While the foregoing is directed to embodiments of the present disclosure, other and further embodiments of the disclosure may be devised without departing from the basic scope thereof.

The invention claimed is:

1. A method of substrate processing, comprising:
   flowing a purge gas into a substrate processing chamber housing a substrate clamped to a chuck with a process kit surrounding the substrate and the chuck, wherein the purge gas is introduced at a location above the substrate, wherein the purge gas flows over an upper surface of the substrate, around an outer edge of the substrate, and between the chuck and the process kit towards an outlet of the substrate processing chamber;
   dechucking the substrate while the purge gas is flowing;
   stopping the flow of the purge gas into the substrate processing chamber after dechucking the substrate; and
   transferring the dechucked substrate out of the substrate processing chamber while the flow of the purge gas is stopped.

2. The method of claim 1, wherein the purge gas is discharged from the substrate processing chamber at a location below the substrate.

3. The method of claim 1, wherein the substrate is dechucked while the purge gas is flowing from above the substrate to below the substrate.

4. The method of claim 1, wherein a flow rate of the purge gas is controlled based on a pressure in the substrate processing chamber.

5. The method of claim 4, wherein the flow rate of the purge gas is controlled to maintain the pressure less than 150 m Torr.

6. The method of claim 1, further comprising lifting the substrate off of the chuck.

7. An apparatus for substrate processing, comprising:
   a processing chamber having an inlet for directing a flow of a purge gas into the processing chamber and an outlet for discharging the purge gas from the processing chamber;
   a chuck disposed in the processing chamber and being configured to support a substrate housed in the processing chamber and to chuck and dechuck the substrate, wherein the inlet is located above the chuck and the outlet is located below the chuck, wherein a gas flow path is defined from the inlet, around the chuck, and to the outlet; and
   a controller configured to:
      flow the purge gas into the processing chamber while the substrate is clamped to the chuck with a process kit surrounding the substrate and the chuck, wherein the purge gas is introduced at a location above the substrate, wherein the purge gas flows over an upper surface of the substrate, around an outer edge of the substrate, and between the chuck and the process kit towards the outlet of the processing chamber;
      dechuck the substrate while the purge gas is flowing;
      stop the flow of the purge gas into the processing chamber after dechucking the substrate; and
      transfer the dechucked substrate out of the processing chamber while the flow of the purge gas is stopped.

8. The apparatus of claim 7, wherein the processing chamber includes another inlet located below the chuck and above the outlet.

9. The apparatus of claim 7, further comprising the process kit surrounding the chuck.

10. The apparatus of claim 7, further comprising lift pins extending through the chuck configured to lift the substrate away from the chuck.

11. A system for processing substrates, comprising:
    an apparatus for substrate processing, comprising:
       a processing chamber having an inlet for directing a flow of a purge gas into the processing chamber and an outlet for discharging the purge gas from the processing chamber; and
       a chuck disposed in the processing chamber and being configured to support a substrate housed in the processing chamber and to chuck and dechuck the substrate, wherein the inlet is located above the chuck and the outlet is located below the chuck, wherein a gas flow path is defined from the inlet, around the chuck, and to the outlet; and a controller configured to:
- control the flow of the purge gas through the inlet into the processing chamber based on a pressure inside the processing chamber while dechucking the substrate;
- flow the purge gas into the processing chamber while the substrate is clamped to the chuck with a process kit surrounding the substrate and the chuck, wherein the purge gas is introduced at a location above the substrate, wherein the purge gas flows over an upper surface of the substrate, around an outer edge of the substrate, and between the chuck and the process kit towards the outlet of the processing chamber;
- dechuck the substrate while the purge gas is flowing;
- stop the flow of the purge gas into the processing chamber after dechucking the substrate; and
- transfer the dechucked substrate out of the processing chamber while the flow of the purge gas is stopped.

12. The system of claim 11, wherein the processing chamber includes another inlet located below the chuck and above the outlet.

13. The system of claim 11, further comprising the process kit surrounding the chuck.

14. The system of claim 11, further comprising lift pins extending through the chuck configured to lift the substrate away from the chuck.

15. The system of claim 11, wherein the purge gas is process compatible.

16. The system of claim 11, wherein the controller comprises a flow controller configured to control a flow rate of the purge gas through the inlet and into the processing chamber.

17. The system of claim 16, wherein the flow controller is configured to control the flow rate of the purge gas to maintain the pressure inside the processing chamber below a predetermined value.

18. The system of claim 17, wherein the predetermined value is 150 m Torr.

* * * * *